(12) United States Patent
Lin et al.

(10) Patent No.: US 11,765,845 B2
(45) Date of Patent: Sep. 19, 2023

(54) ELECTRONIC APPARATUS WITH MOUNTING MECHANISM

(71) Applicant: Nanning FuLian FuGui Precision Industrial Co., Ltd., Nanning (CN)

(72) Inventors: Chih-Hsuan Lin, New Taipei (TW); Ying-Jui Huang, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 209 days.

(21) Appl. No.: 17/387,957

(22) Filed: Jul. 28, 2021

(65) Prior Publication Data
US 2023/0031822 A1    Feb. 2, 2023

(51) Int. Cl.
*H05K 5/00*      (2006.01)
*H05K 5/02*      (2006.01)
*H05K 7/14*      (2006.01)

(52) U.S. Cl.
CPC .......... *H05K 5/0221* (2013.01); *H05K 5/023* (2013.01); *H05K 7/14* (2013.01)

(58) Field of Classification Search
CPC .... H05K 5/0221; H05K 5/023; H05K 5/0204; H05K 7/14; H05K 7/1489; H05K 7/183
USPC ......... 312/334.4, 334.5, 223.1, 265.1–265.4, 312/319.1; 211/26; 248/298.1, 243; 361/679.58, 725, 726
See application file for complete search history.

(56) References Cited

U.S. PATENT DOCUMENTS

| | | | | |
|---|---|---|---|---|
| 5,833,337 A | * | 11/1998 | Kofstad | H05K 7/1489 211/175 |
| 6,360,900 B1 | * | 3/2002 | Carbonneau | H05K 7/183 312/265.4 |
| 8,701,902 B2 | * | 4/2014 | Oura | H05K 7/1421 312/334.3 |
| 2004/0217073 A1 | * | 11/2004 | Dobler | H05K 7/1489 211/26 |
| 2010/0085704 A1 | * | 4/2010 | Liu | G06F 1/181 361/679.58 |
| 2011/0100934 A1 | * | 5/2011 | Hsu | H05K 7/1489 211/26 |

(Continued)

FOREIGN PATENT DOCUMENTS

CN      1302738 C       3/2007
CN      203252223 U    10/2013

(Continued)

OTHER PUBLICATIONS

CN115686141 English translation (Year: 2023).*
TW1782642 English translation (Year: 2022).*
CN110267481 English translation (Year: 2019).*

*Primary Examiner* — Janet M Wilkens
(74) *Attorney, Agent, or Firm* — ScienBiziP, P.C.

(57) ABSTRACT

A mounting mechanism for a server or other electronic apparatus allowing the addition of modules or devices of different sizes includes a casing having an opening. A guiding track is disposed in the casing; a slide bar is movably disposed on the guiding track; a restriction structure is disposed on the first end of the guiding track; and a locking structure can pivot on the restriction structure. When the casing is mounted on a rear rack, the slide bar is moved out of the casing via the opening, and the restriction structure and the locking structure are securely fastened to the frame.

9 Claims, 6 Drawing Sheets

(56) References Cited

U.S. PATENT DOCUMENTS

2013/0026113 A1* 1/2013 Fan ................. H05K 7/1489
                                                        211/26
2013/0112638 A1* 5/2013 Dittus ................ H05K 7/183
                                                        211/123
2019/0373759 A1* 12/2019 Chen ................ H05K 5/0204

FOREIGN PATENT DOCUMENTS

| CN | 110267481 | * | 9/2019 |
| CN | 115686141 | * | 2/2023 |
| EP | 3154322 | * | 4/2017 |
| EP | 3751971 | * | 12/2020 |
| TW | I254603 B | | 5/2006 |
| TW | 201430840 A | | 8/2014 |
| TW | 1782642 | * | 11/2022 |

* cited by examiner

ELECTRONIC APPARATUS WITH MOUNTING MECHANISM

FIELD

The subject matter herein generally relates to an electronic apparatus with a mounting mechanism.

BACKGROUND

In order to increase the density of servers, multiple servers are generally installed on the same frame. Moreover, in order to accommodate various servers of different sizes, telescopic tracks are installed on the servers so that servers of different sizes can be installed on the same frame.

However, the installation of the telescopic track on the server is complicated, which makes it difficult to mount additional servers on the frame.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
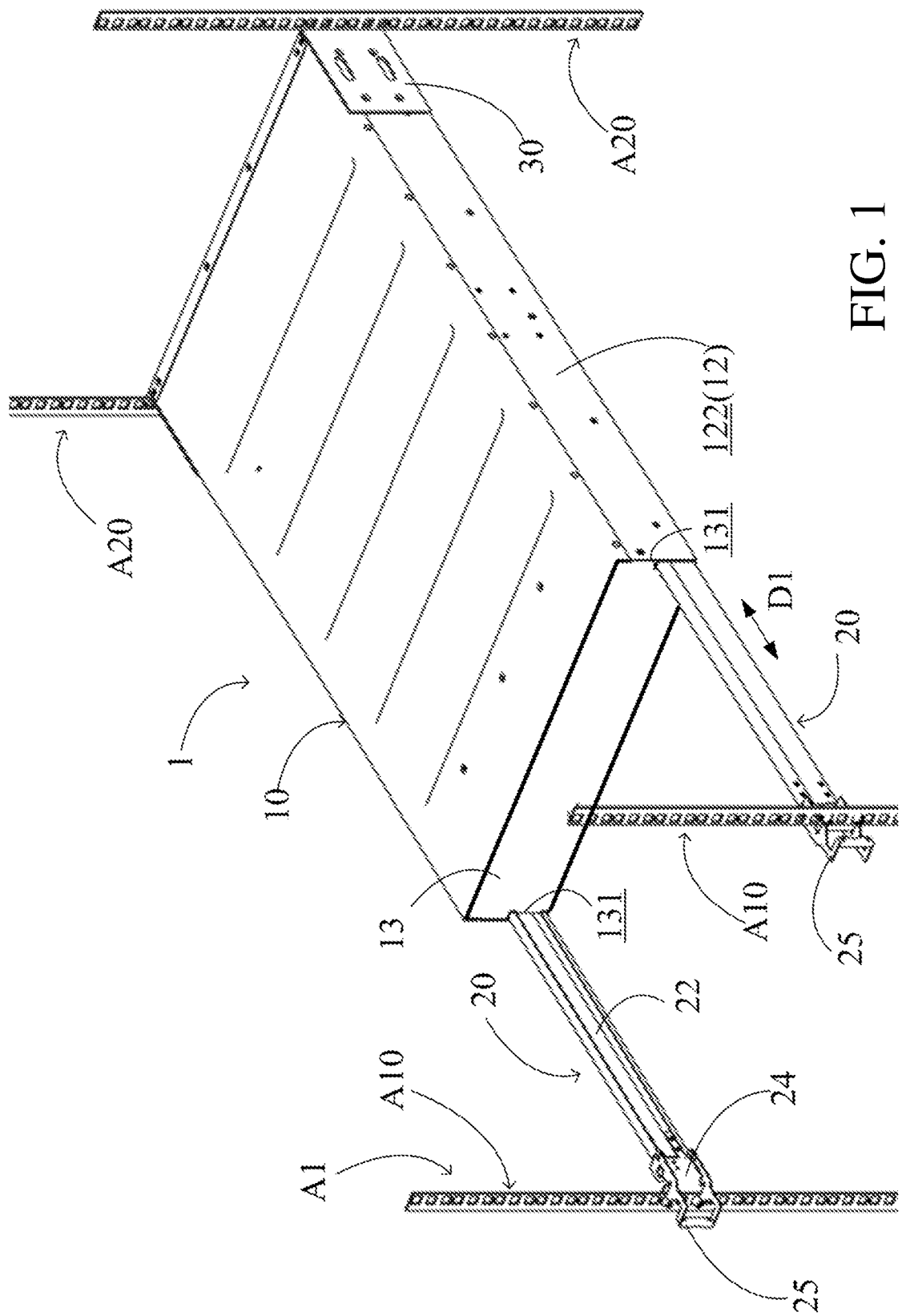
FIG. 1 is a perspective view of an electronic apparatus with a mounting mechanism in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
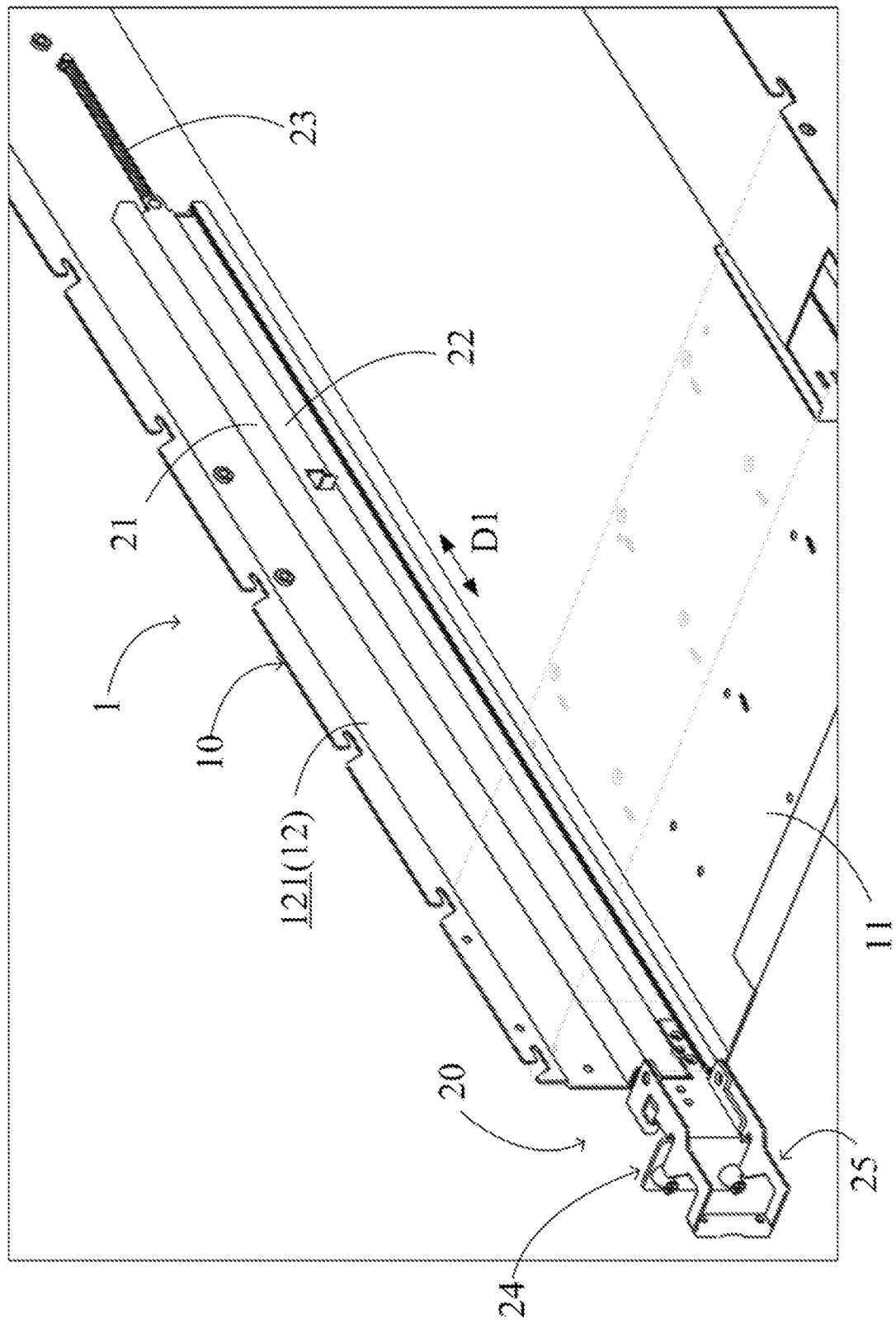
FIG. 2 is a perspective view of a casing and a mounting mechanism of the electronic apparatus in FIG. 1.
Figure 3:
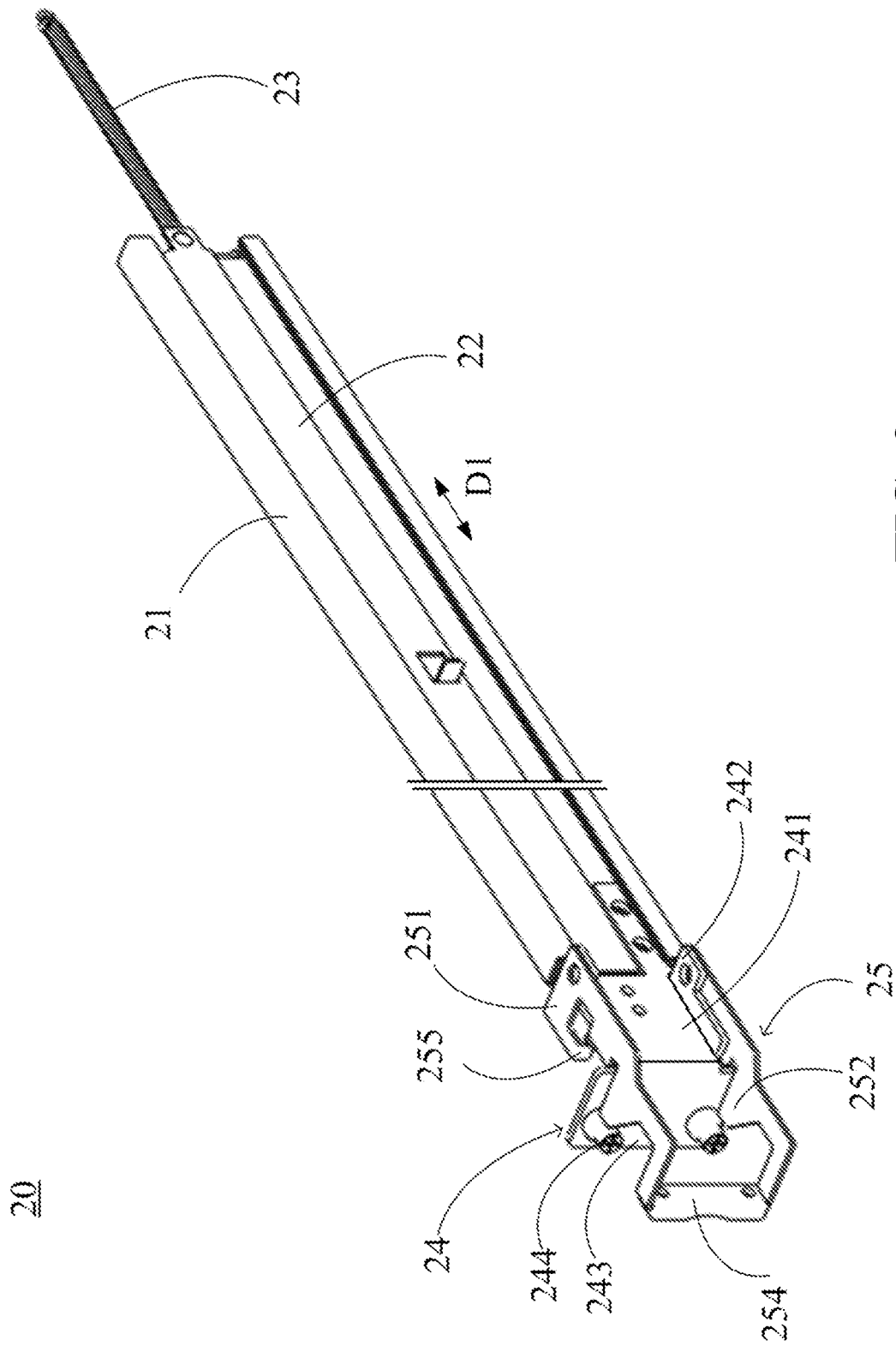
FIG. 3 is a perspective view of the mounting mechanism of FIG. 2.
Figure 4:
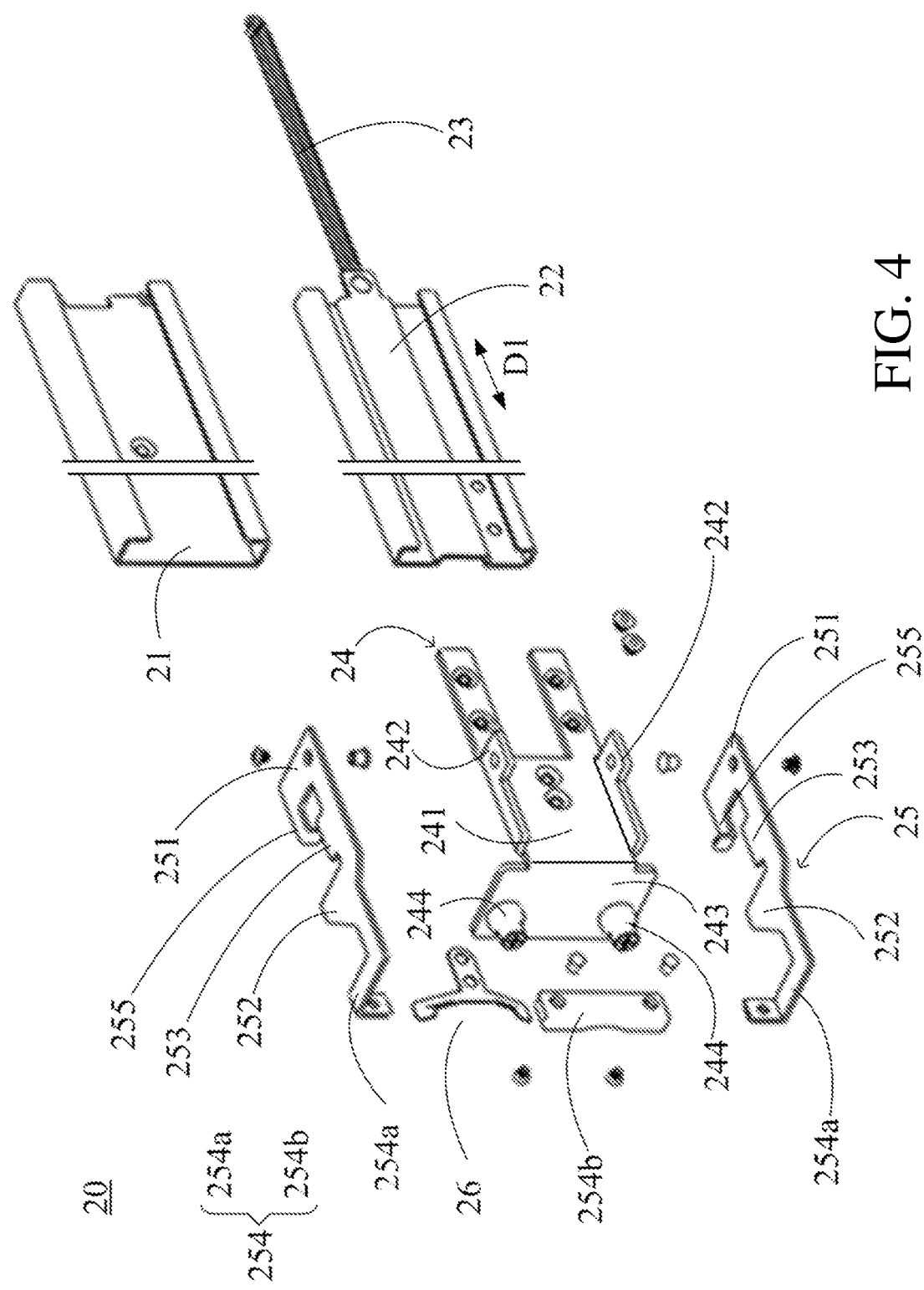
FIG. 4 is an exploded view of the mounting mechanism of FIG. 3.

FIG. 1 is a perspective view of an electronic apparatus 1 with a mounting mechanism 20 in accordance with an embodiment of the present disclosure. FIG. 2 is a perspective view of a casing 10 and a mounting mechanism 20 of the electronic apparatus 1. FIG. 2 shows a portion of the casing 10. FIG. 3 is a perspective view of the mounting mechanism 20 of FIG. 2. FIG. 4 is an exploded view of the mounting mechanism 20 of FIG. 3. The electronic apparatus 1 may be a server, a router, or a computer, not being limited thereto.

The electronic apparatus 1 includes a casing 10, two mounting mechanisms 20, and two retaining structures 30. The mounting mechanisms 20 are telescopically disposed in the casing 10. When the electronic apparatus 1 is mounted on the frame A1, the retaining structures 30 are affixed to the outer surface 122 of the casing 10 first, and then the retaining structures 30 are affixed to the front rack A20. Afterward, the length of mounting mechanism 20 can be increased to connect the mounting mechanism 20 to the rear rack A10 of the frame A1. When the mounting mechanism 20 is released, the casing 10 is mounted on the rear rack A10 and the installation of the electronic apparatus 1 is completed. Accordingly, the electronic apparatus 1 can be mounted in the frame A1 of different specifications by the mounting mechanism 20.

The casing 10 includes a bottom plate 11, two side walls 12 and a rear wall 13. The side walls 12 and the rear wall 13 extend perpendicular to the bottom plate 11. Two side walls 12 are parallel to each other, and are perpendicular to the rear wall 13. An opening 131 is formed on each of two opposite edges of the rear wall 13. Various components inside the casing 10, such as a motherboard, a chip, a memory, an electrical connector, and/or a fan, are not shown in figures.

Each mounting mechanism 20 include a guiding track 21, a slide bar 22, a spring 23, a restriction structure 24, a locking structure 25, and an elastic element 26. The guiding track 21 is disposed in the casing 10, and is affixed to the inner surface 121 of the side wall 12. The guiding track 21 is an elongated structure, extending in a movement direction D1. The slide bar 22 is movably disposed on the guiding track 21 in the movement direction D1. The slide bar 22 is an elongated structure, elongated in the movement direction D1. In this embodiment, the guiding track 21 restricts the slide bar 22 to move in the movement direction D1. The spring 23 is in the casing 10, and connected to the second end of the slide bar 22 and the inner surface 121 of the casing 10. The spring 23 applies a pulling force to the slide bar 22. Until the mounting mechanism 20 is mounted on the rear rack A10, the slide bar 22 is pulled by the spring 23 to an initial position.

The restriction structure 24 is disposed on the first end of the guiding track 21. The restriction structure 24 is partially or completely exposed outside the casing 10. When the slide bar 22 is at the initial position, the restriction structure 24 is adjacent to the opening 131. The restriction structure 24 includes a body portion 241, two connection portions 242, an abutting portion 243, and one or more latches 244. The body portion 241, the connection portions 242, and the abutting portion 243 are made from a metal plate. The body portion 241 is a Y-shaped plate, extending in the movement direction D1, and affixed to the first end of the guiding track 21. The connection portions 242 are connected to the body portion 241, and allow the locking structure 25 to pivot. The connection portion 242 is a plate. Moreover, the connection portions 242 are parallel to each other, and perpendicular to the body portion 241.

The abutting portion 243 is connected to the body portion 241. The abutting portion 243 is a plate, perpendicular to the body portion 241. The connection portions 242 and the abutting portion 243 are connected to opposite sides of the body portion 241, and extend in opposite directions. The latches 244 are disposed on the abutting portion 243. The latches 244 are columnar structures, and perpendicular to the abutting portion 243. When the casing 10 is mounted on the rear rack A10 by the mounting mechanism 20, the abutting portion 243 abuts the first side of the rear rack A10, and the latches 244 are engaged to the rear rack A10.

The locking structure 25 can pivot on the restriction structure 24. The locking structure 25 includes two pivoting portions 251, two retaining portions 252, two protrusion portions 253, a handle 254, and two pressing portions 255. The pivoting portions 251 are pivoted on the connection portions 242 of the restriction structure 24. The pivoting portions 251 are L-shaped plates. The retaining portions 252 are connected to the pivoting portions 251, and are metal plates. Each protrusion portion 253 is connected to the pivoting portion 251, and between the pivoting portions 251 and the retaining portion 252. The protrusion portion 253 is a plate. The maximum width of the pivoting portion 251 and the maximum width of the retaining portion 252 are greater than the maximum width of the protrusion portion 253. Such maximum widths are measured in the same direction that perpendicular to the movement direction D1.

The handle 254 is a U-shaped structure, and two ends of the handle 254 are connected to two retaining portions 252. In this embodiment, the handle 254 includes two extension portions 254a and a holding portion 254b. An extension portion 254a is connected to each of two retaining portions 252. Two ends of the holding portions 254b are connected to two extension portions 254a. The extension portions 254a are L-shaped structures. Two pressing portions 255 are respectively connected to two pivoting portions 251. Each pressing portion 255 is an L-shaped structure. One end of the pressing portion 255 is perpendicular to the pivoting portion 251.

In this embodiment, the connected pivoting portion 251, retaining portion 252, protrusion portion 253, extension portion 254a, and pressing portion 255 are made from one metal plate. Moreover, the connected pivoting portion 251, retaining portion 252, and protrusion portion 253 extend along a plane that is perpendicular to the movement direction D1, and form an E-shaped structure, to improve the strength of the locking structure 25.

The elastic element 26 is disposed on the body portion 241 of the restriction structure 24. In this embodiment, the elastic element 26 is a T-shaped leaf spring. Two ends of the elastic element 26 are respectively adjacent to two pressing portions 255, and separated from the body portion 241. When the locking structure 25 is rotated relative to the restriction structure 24, the pressing portions 255 press against the elastic elements 26, and the elastic elements 26 provide an elastic force to the pressing portions 255, urging the restoration of the locking structure 25 to the initial position.

Figure 5:
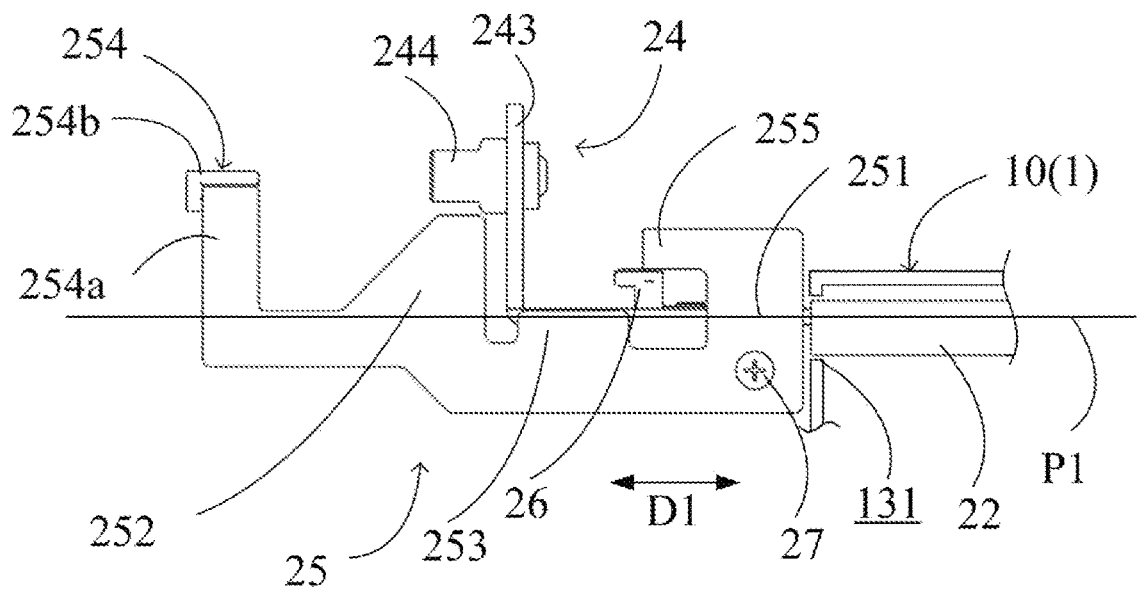
FIG. 5 and FIG. 6 show intermediate stages of mounting an electronic apparatus on a rear rack.
Figure 6:
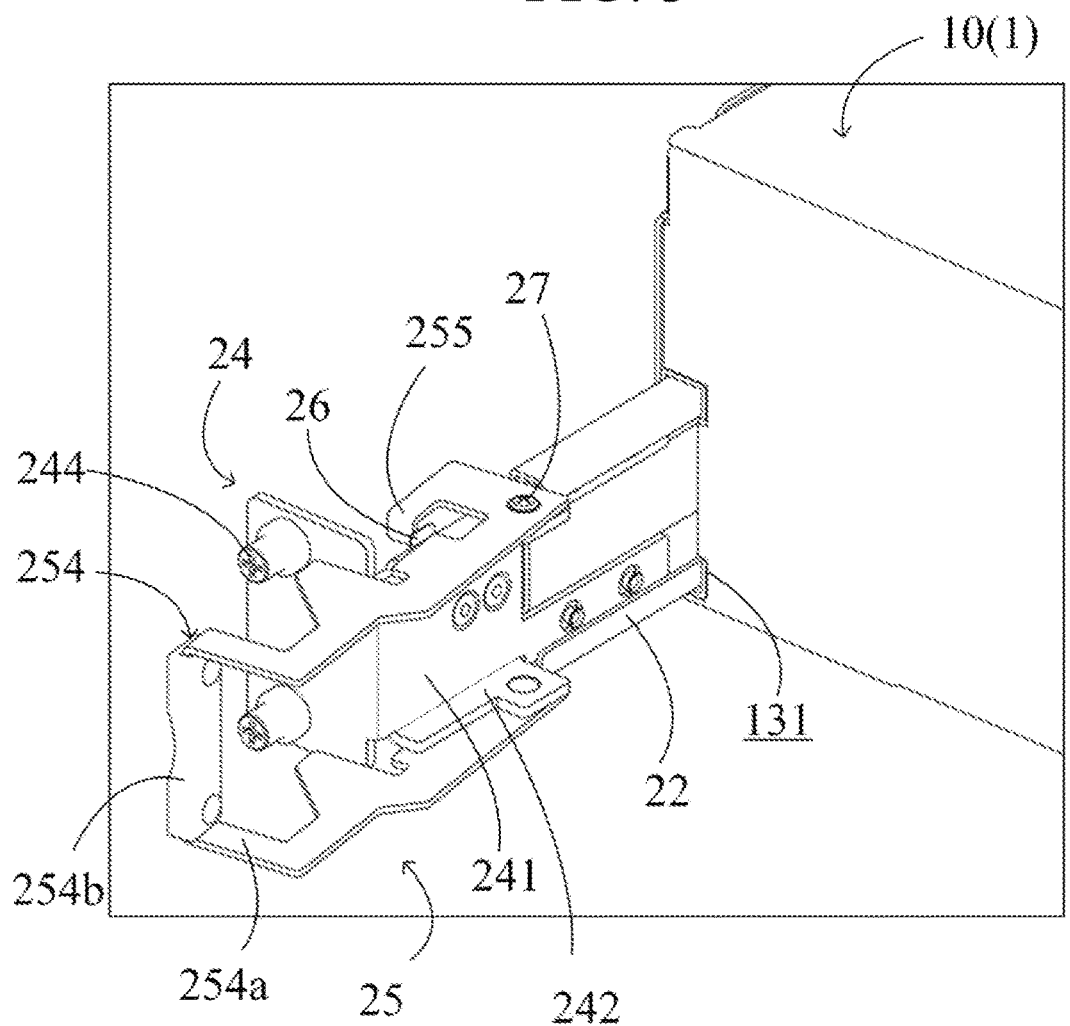

FIG. 5 and FIG. 6 show intermediate stages of mounting the electronic apparatus 1 on the rear rack A10. First, the user holds the handle 254 to move the slide bar 22 in the movement direction D1 to extend the slide bar 22 out of the casing 10 through the opening 131. When the handle 254 moves the slide bar 22, the locking structure 25 is rotated from the initial position (of FIG. 5) to the offset position relative to the restriction structure 24 (see FIG. 6).

In this embodiment, the pivoting portion 251 is rotated about a shaft 27 relative to the restriction structure 24, and the slide bar 22 extends along a plane P1. The holding portion 254b and the shaft 27 are separated from the plane P1, and the plane P1 is between the holding portion 254b and the shaft 27. Therefore, when the user pulls the handle 254 in the movement direction D1, the holding portion 254b has a turning moment relative to the shaft 27, which causes the locking structure 25 to rotate. When the locking structure 25 is rotated relative to the restriction structure 24, the pressing portions 255 presses against the elastic element 26, and the elastic element 26 applies an elastic force to the pressing portion 255. Moreover, the pressing portion 255 prevents excessive rotation of the locking structure 25 relative to the restriction structure 24.

Figure 7:
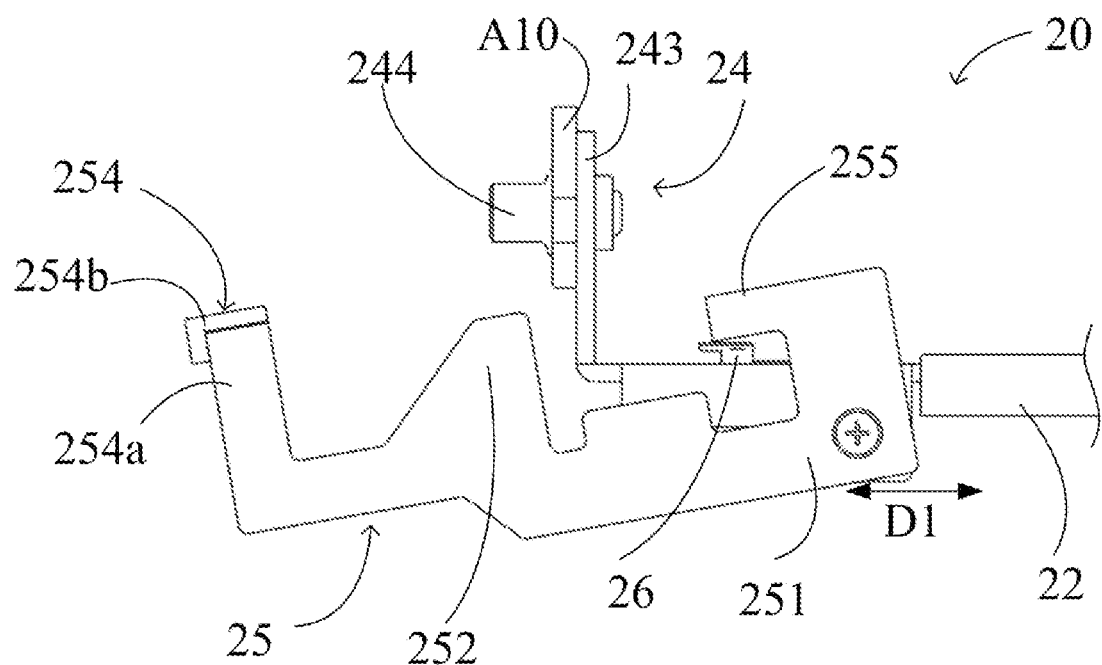
FIG. 7 and FIG. 8 show intermediate stages of the mounting mechanism being mounted on the rear rack.
Figure 8:
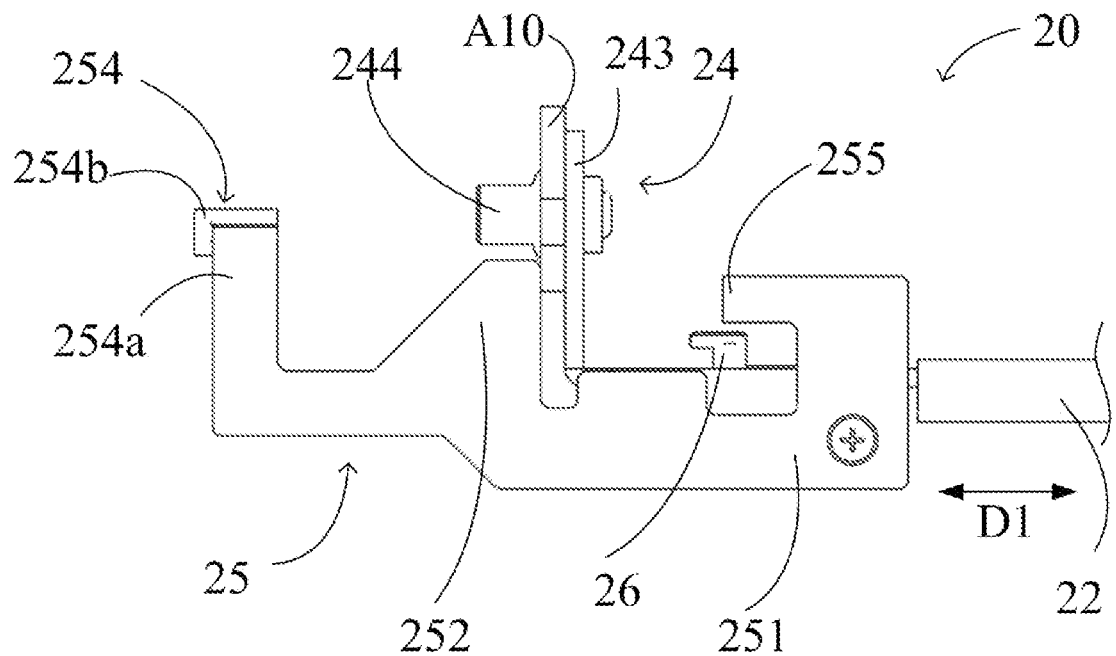

FIG. 7 and FIG. 8 show intermediate stages of mounting the mounting mechanism 20 on the rear rack A10. When the handle 254 is pulled in the movement direction D1, the latch 244 can be inserted into rear rack A10, and the abutting portion 243 abuts the first side of the rear rack A10. After the latch 244 is inserted into the rear rack A10, the user can release handle 254. At this time, the elastic element 26 pushes the pressing portion 255 to restore the locking structure 25 to the initial position (as in FIG. 8).

As shown in FIG. 8, when the casing 10 is mounted on the rear rack A10 by the mounting mechanism 20, the retaining portion 252 is in contact with the second side of the rear rack A10, and the spring 23 of FIG. 2 provides pulling force to the retaining portion 252. Moreover, the latch 244 is inserted into the rear rack A10, and the abutting portion 243 abuts the first side of the rear rack A10. Therefore, the casing 10 can be firmly mounted on the rear rack A10 by the mounting mechanism 20.

According to the embodiments of the disclosure, the mounting mechanism is stored in the casing of the electronic apparatus. When the electronic apparatus is mounted on the frame, the mounting mechanism can be directly pulled out from the casing to the rear rack of the frame, and the electronic apparatus can be easily installed in the rear rack, and the electronic apparatus can be easily installed in the rear rack. The user does not need to mount sliding tracks by complicated steps. In addition, the user does not need additional tools for mounting the mounting mechanism, thereby improving the convenience of installation.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An electronic apparatus, comprising:
a casing comprising an opening;
a guiding track disposed on the casing;
a slide bar movably disposed on the guiding track;
a restriction structure disposed on a first end of the guiding track; and
a locking structure pivoted on the restriction structure, and comprising:
a pivoting portion pivoted on the restriction structure;
a retaining portion connected to the pivoting portion; and
a handle connected to the retaining portion;
wherein when the casing is mounted on a rear rack, the slide bar is configured to be moved out of the casing via the opening, and each of the restriction structure and the locking structure is fastened to a frame,
when the handle is pull to move the slide bar, the locking structure is rotated from an initial position to an offset position relative to the restriction structure.

2. The electronic apparatus as claimed in claim 1, wherein the restriction structure comprises:
a body portion affixed to the first end;
a connection portion connected to the body portion, and pivoted on the locking structure;
an abutting portion connected to the body portion; and
a latch disposed on the abutting portion,
wherein when the casing is mounted on the rear rack, the abutting portion abuts a first side of the rear rack, and the latch is engaged to the rear rack.

3. The electronic apparatus as claimed in claim 2, wherein each of the connection portion and the abutting portion extends perpendicular to the body portion, and the latch extends perpendicular to the abutting portion.

4. The electronic apparatus as claimed in claim 1, wherein when the casing is mounted to the rear rack, the retaining portion is in contact with a second side of the rear rack.

5. The electronic apparatus as claimed in claim 1, wherein the handle comprises:
an extension portion connected to the retaining portion; and
a holding portion connected to the extension portion;
wherein the pivoting portion is rotated about a shaft relative to the restriction structure, the slide bar extends along a plane, the holding portion is not on the plane, and the plane is between the holding portion and the shaft.

6. The electronic apparatus as claimed in claim 1, further comprising an elastic element disposed on the restriction structure, wherein the locking structure further comprises a pressing portion connected to the pivoting portion,
when the locking structure is rotated relative to the restriction structure, the pressing portion presses the elastic element.

7. The electronic apparatus as claimed in claim 1, wherein the locking structure further comprises a protrusion portion between the retaining portion and the pivoting portion, and the pivoting portion, the retaining portion and the protrusion portion are formed as a E-shaped structure.

8. An electronic apparatus, comprising:
a casing comprising an opening;
a guiding track disposed on the casing;
a slide bar movably disposed on the guiding track;
a spring in the casing, each end of the spring is connected to a second end of the slide bar and an inner surface of the casing, respectively;
a restriction structure disposed on a first end of the guiding track; and
a locking structure pivoted on the restriction structure;
wherein when the casing is mounted on a rear rack, the slide bar is configured to be moved out of the casing via the opening, and each of the restriction structure and the locking structure is fastened to a frame.

9. The electronic apparatus as claimed in claim 8, further comprising a retaining structure affixed to an outer surface of the casing, wherein the retaining structure is affixed to a front rack.

\* \* \* \* \*